(12) United States Patent
Lin

(10) Patent No.: US 12,283,638 B2
(45) Date of Patent: Apr. 22, 2025

(54) NON-SOLDER PAD ULTRAFINE MAIN BUSBAR BACK-CONTACT SOLAR CELL, BACK-CONTACT SOLAR CELL MODULE AND PREPARATION METHOD THEREOF

(71) Applicant: Golden Solar (Quanzhou) New Energy Technology Co., Ltd., Quanzhou (CN)

(72) Inventor: Kairui Lin, Quanzhou (CN)

(73) Assignee: Golden Solar (Quanzhou) New Energy Technology Co., Ltd., Quanzhou (CN)

( * ) Notice: Subject to any disclaimer, the term of this patent is extended or adjusted under 35 U.S.C. 154(b) by 0 days.

(21) Appl. No.: 18/437,421

(22) Filed: Feb. 9, 2024

(65) Prior Publication Data
US 2025/0022970 A1 Jan. 16, 2025

(30) Foreign Application Priority Data
Jul. 14, 2023 (CN) .......................... 202310861730.X

(51) Int. Cl.
H01L 31/0224 (2006.01)
H01L 31/05 (2014.01)

(52) U.S. Cl.
CPC .. H01L 31/022441 (2013.01); H01L 31/0516 (2013.01)

(58) Field of Classification Search
CPC ................... H01L 31/022441; H01L 31/0516
See application file for complete search history.

(56) References Cited

FOREIGN PATENT DOCUMENTS

| | | |
|---|---|---|
| CN | 103441156 A | 12/2013 |
| CN | 208767310 U | 4/2019 |
| CN | 209981250 U | 1/2020 |
| CN | 210040210 U | 2/2020 |
| CN | 111725335 A | 9/2020 |
| CN | 213988898 U | 8/2021 |
| CN | 114388636 A | 4/2022 |
| CN | 114566555 A | 5/2022 |
| CN | 115148839 A | 10/2022 |

(Continued)

OTHER PUBLICATIONS

English machine translation of CN 111725335A. (Year: 2019).*

(Continued)

*Primary Examiner* — Lindsey A Buck
(74) *Attorney, Agent, or Firm* — Gunther J. Evanina; BUTZEL

(57) ABSTRACT

The present disclosure provides a non-solder pad ultrafine main busbar back-contact solar cell, a back-contact solar cell module, and a preparation method, wherein the back-contact cell includes a first finger and a second finger, a first main busbar line, a second finger, a first insulation layer, and a second insulation layer, wherein the widths of the first main busbar line and the second main busbar line in the X-axis direction are each independently 10-100 μm; the first main busbar lines or the second main busbar lines are respectively provided in an extending manner or at intervals along the same axis perpendicular to the corresponding fingers connected thereto, and when spaced apart, the distance L between two adjacent corresponding main busbar lines in the Y-axis direction is 5-100 mm.

10 Claims, 7 Drawing Sheets

(56) References Cited

FOREIGN PATENT DOCUMENTS

| | | | |
|---|---|---|---|
| CN | 115498055 | A | 12/2022 |
| CN | 115588705 | A | 1/2023 |
| CN | 115588711 | A | 1/2023 |
| CN | 218414596 | U | 1/2023 |
| CN | 116247120 | A | 6/2023 |
| CN | 116581171 | A | 8/2023 |
| WO | WO 2017/068959 | | 10/2016 |

OTHER PUBLICATIONS

First search of priority application CN202310861730X, Jul. 23, 2014, 2 pages.
International Search Report of PCT_CN2023_119503, dated Dec. 11, 2023, 5 pages.
OA1 of priority application of CN202310861730X, dated Aug. 19, 2023, 10 pages.
OA2 of priority application of CN202310861730X, dated Sep. 12, 2023, 3 pages.
Written Opinion of The International Searching Authority of PCT_CN2023_119503, dated Dec. 11, 2023, 4 pages.
English Abstract of cited patent documents, undated, 6 pages.
English translation of International Search Report of PCT_CN2023_119503, Dec. 11, 2023, 5 pages.
English translation of Notification to Grant Patent Right for Invention of priority application CN202310861730X, undated, 2 pages.
English translation of OA1 of priority application of CN202310861730X, Jun. 9, 2021, 6 pages.
English translation of OA2 of priority application of CN202310861730X, undated, 4 pages.
English translation of Written Opinion of The International Searching Authority of PCT_CN2023_119503, Dec. 11, 2023, 4 pages.

* cited by examiner

NON-SOLDER PAD ULTRAFINE MAIN BUSBAR BACK-CONTACT SOLAR CELL, BACK-CONTACT SOLAR CELL MODULE AND PREPARATION METHOD THEREOF

CROSS-REFERENCES TO RELATED APPLICATIONS

The present disclosure claims priority to Chinese Patent Application No. 202310861730X filed on Jul. 14, 2023, and entitled "Non Solder Pad Ultrafine Main Busbar Back-Contact Solar Cell, Back-Contact Solar Cell Module and Preparation Method Thereof", the contents of which are incorporated herein by reference in its entirety.

TECHNICAL FIELD

The present disclosure belongs to the field of back-contact cell technology, and specifically relates to non-solder pad ultrafine main busbar back-contact solar cell, back-contact solar cell module, and preparation method thereof.

BACKGROUND ART

The back-contact solar cell is a kind of cell with both emitter and base-contact electrode are provided at the back side of the cell (not on the light-receiving side or the front side), the light-receiving side or the front side of the cell does not have any metal electrode to block, which effectively increases the short-circuit current of the cell, and at the same time, the back side can allow for a wider metal grid line to reduce the series resistance and thus improve the filling factor; and the cell without front-side blocking not only has high conversion efficiency, but also is more aesthetic, while the module of fully back-contact electrode is easier to assemble.

For back-contact solar cells, the electrode structure is the core technology of the cell. In the existing electrode structure of back-contact solar cell, the pad is usually provided on the main busbar line. In the first structure, the main busbar line and its pad are distributed on the edge of the cell on both sides, and in the second structure, the main busbar line and its pad are distributed in the non-edge area of the cell and the width of the main busbar line is generally greater than 0.1 mm or greater than 0.5 mm, and the size of the pad is close to 1 mm×1 mm.

However, the following problems exist in the structure of the back-contact solar cell in the prior art. For the above-mentioned first structure, a) the conductivity requirements of the finger are very high, the area of the finger accounts for more than 80% of the back side of the cell, and the cell bifaciality is low; b) the thickness of the copper grid electrode is very high, which seriously affects the production capacity of the copper grid electrode equipment; and c) the environmental protection issues exists in the copper grid process. For the above-mentioned second structure, d) the main busbar line and pad need to use a large amount of low-temperature silver paste, so the material cost is high; e) after high-temperature series welding of production modules, phenomena such as large deformation of the cell and insufficient welding tension between the welding strip and the main busbar line exists, thereby affecting the production yield of the cell-sheet production module.

SUMMARY

The objects of the present disclosure include, for example, overcoming the defects of high silver consumption, high deformation after welding, low tensile force, and low production yield of back-contact solar cells existing in the prior art, and providing a non-solder pad ultrafine main busbar back-contact solar cell and a back-contact solar cell module, and a preparation method thereof. The back-contact cell has the advantages of low cost (low silver consumption) and high bifaciality, and also has the advantages of high connecting strength between the welding strip and cell, and low deformation of the cell after connecting during the module production, which is capable of increasing the production yields of the production of the back-contact solar cell module and ensuring a high CTM value at the same time.

In order to achieve the above objects, in the first aspect, the present disclosure provides a non-solder pad ultrafine main busbar back-contact solar cell, including a first finger and a second finger arranged alternately along a Y-axis direction on the back side and both extended and provided in an X-axis direction to collect currents of two different polarities of the cell, a first main busbar line perpendicular to the first finger, a second main busbar line perpendicular to the second finger, a first insulation layer, in a Z-axis direction, provided between and respectively being in contact with the first main busbar line and the second finger, and a second insulation layer provided between and respectively being in contact with the second main busbar line and the first finger, wherein the first main busbar line is connected to at least two first fingers and at least one of the connected first fingers is closest to the X-axis edge on the back side, and the second main busbar line is connected to at least two second fingers and at least one of the connected second fingers is closest to the X-axis edge on the back side; no pad is provided on the first main busbar line and second main busbar line, and the widths in the X-axis direction of the first main busbar line and second main busbar line are each independently 10-100 μm; and the first main busbar lines or second main busbar lines are provided in an extending manner or at intervals along the same axis perpendicular to the corresponding finger connected thereto, respectively, and when spaced apart, the distance L between two adjacent corresponding main busbar lines in the Y-axis direction is 5-100 mm, preferably 10-100 mm.

In one or more optional embodiments, the first main busbar lines and the second main busbar lines are provided in pairs and their pairs are provided at least in regions on both sides of the back side of the cell in the X-axis direction and/or in the Y-axis direction.

More preferably, the first main busbar line is provided on the Y-axis central axis of the first insulation layer in contact therewith or on the side of the Y-axis central axis, and the second main busbar line is provided on the Y-axis central axis of the second insulation layer in contact therewith or on the side of the Y-axis central axis.

Further preferably, the first main busbar line and/or second main busbar line are provided on the Y-axis central axis of the corresponding insulation layer in contact therewith and extend from one end of the back side of the cell in the Y-axis direction to the other end, respectively.

In one or more optional embodiments, the first main busbar line comprises a first edge main busbar line proximate to an X-axis edge on the back side, and the second main busbar line comprises a second edge main busbar line proximate to an X-axis edge on the back side, wherein the first edge main busbar line and the second edge main busbar line both comprise a paired left main busbar line and right main busbar line, and the paired left main busbar line and right main busbar line are provided on two sides of the Y-axis center axis of the same corresponding insulation layer, respectively.

More preferably, the first main busbar line further comprises a first middle main busbar line located in the middle of the Y-axis of the back side, and the second main busbar line further comprises a second middle main busbar line located in the middle of the Y-axis of the back side, wherein the first middle main busbar line and the second middle main busbar line are respectively located on the Y-axis central axis of the corresponding insulation layer in contact therewith, and in the Y-axis direction, the distance L between the adjacent corresponding edge main busbar line and the corresponding middle main busbar line, and/or between the two adjacent corresponding middle main busbar lines, is 10-100 mm.

In one or more optional embodiments, the thicknesses in the Z-axis direction of the first main busbar line and the second main busbar line are each independently 5-30 μm; and the first finger and the second finger each independently meet: the width in the Y-axis direction is 10-100 μm, and the thickness in the Z-axis direction is 5-20 μm. The second insulation layer and first insulation layer each independently satisfy: the length in the X-axis direction is 1-5 mm, the width in the Y-axis direction is 150-900 μm, and the thickness in the Z-axis direction is 20-70 μm.

In one or more optional embodiments, the number of corresponding fingers connected to the first main busbar line and the second main busbar line, respectively, is 2-10, wherein the first main busbar line and the second main busbar line are provided in pairs, and 2-20 pairs of corresponding main busbar lines are provided for each cell.

In one or more optional embodiments, the second insulation layer and the first insulation layer are arranged alternatively and form two adjacent columns along the Y-axis direction, and at least part of the corresponding insulation layer is provided with corresponding main busbar lines, which are respectively spaced apart in the X-axis direction of their corresponding fingers.

In a second aspect, the present disclosure provides a back-contact solar cell module, comprising a number of cells arranged in series. The cells are non-solder pad ultrafine main busbar back-contact solar cells as described in the first aspect, and the back-contact solar cell module further comprises a number of welding strips and curing adhesive, wherein the welding strip is provided on the Z-axis direction of each insulation layer and corresponding main busbar line thereon and extends in the Y-axis direction. The welding strips are provided for connecting a number of cells in series, the curing adhesive is provided above the Z-axis direction in the welding strip region corresponding to the corresponding main busbar lines, and the length in the Y-axis direction of the curing adhesive is smaller than the length in Y-axis direction of the corresponding main busbar lines below it.

In one or more optional embodiments, on the same welding strip, the curing adhesives are spaced apart in the Y-axis direction.

In one or more optional embodiments, the difference between the length in the Y-axis direction of the curing adhesive and the length in the Y-axis direction of a corresponding main busbar line below it is 1 mm.

In one or more optional embodiments, the length in the X-axis direction of the curing adhesive is greater than the length in the X-axis direction of the welding strip.

In one or more optional embodiments, the welding strip is a copper strip coated with a low melting point welding coating on the outer surface, wherein the width of the copper strip in the X-axis direction is 0.3-2 mm, and the thickness of the copper strip in the Z-axis direction is 0.05-0.2 mm, and the melting point of the low melting point welding coating is lower than 155° C.

In the third aspect, the present disclosure provides a preparation method for a back-contact solar cell module, wherein the back-contact solar cell module is the back-contact solar cell module described in the second aspect, and the preparation method comprises the following steps:
S1: arranging the cells in series and laying the welding strips in the Z-axis direction of each insulation layer arranged along the Y-axis direction of the cells and the corresponding main busbar line thereon;
S2: forming UV adhesive in the corresponding welding strip region on each main busbar line, then curing by UV irradiation to form a curing adhesive; and
S3: sequentially assembling, laying with adhesive films, and setting up the front and back plates for the cell string obtained in S2, and then laminating to connect the welding strip with the corresponding fingers.

In one or more optional embodiments, the thickness of the UV adhesive in S2 is 5-100 μm, and the curing energy is 300-3000 mJ/cm$^2$; and the lamination temperature in S3 is higher than the melting point temperature of the welding strip.

In one or more optional embodiments, the formation of the UV adhesive described in S2 is carried out by dispensing or spraying.

Embodiments of the present disclosure are capable of achieving the following beneficial effects.

The research found that the current preparation method of back-contact solar cell modules needs to weld the welding strip, the cell is deformed after welded with the welding strip, and a larger welding tension is required to fix the welding strip and the cell. The welding tension is directly related to the area of the silver paste connected to the welding strip. The larger the area of the connected silver paste is, the greater the welding tension is. To improve the welding tension, in the current back-contact cell, an entire wider silver paste grid line and multiple larger-area silver paste pads are generally installed, which also significantly increases the consumption of silver paste, and cell deformation will be caused when the pads are welded. In view of this, the non-solder pad ultrafine main busbar back-contact solar cell of the present disclosure does not set up pads, such that welding is not required, thereby avoiding the deformation of the cell caused by welding in the existing technology. The curing adhesive can be used to fixedly connect the welding strip and cell during the subsequent formation of the module, and the welding strip has no need to be processed at high temperatures, thus ensuring the production yield; and the width of the main busbar lines is very small, only 10-100 μm (in the existing technology, the width of the main busbar line is generally greater than 0.1 mm), and when the corresponding main busbar lines are alternatively arranged, the main busbar lines can be formed by segmented printing, thus significantly reducing the consumption of silver paste for the main busbar lines. The distance L between two adjacent corresponding main busbar lines in the Y-axis direction when arranged at intervals is controlled to be 5-100 mm, such that the distance L is appropriate, thereby ensuring the fixed connection between the welding strip and the cell and taking into account the lower amount of silver paste and subsequent curing adhesive, which is conducive to improving the module production yield and reducing the cost of materials. Under the same conditions, if L is too large or too small, it will lead to a decrease in module production yield or an increase in material cost.

Preferably, when arranged at intervals, the distance L between two adjacent corresponding main busbar lines in the Y-axis direction is 10-100 mm, further preferably 30-90 mm, and more preferably 40-80 mm.

In the present disclosure, the back-contact solar cell module uses a non-solder pad ultrafine main busbar back-contact solar cell in combination with welding strip and curing adhesive, wherein the curing adhesive has excellent bonding force. At the same time, the binding process does not require high temperatures, so deformation will not occur on cells. At the same time, the present disclosure sets the length of the curing adhesive in the Y-axis direction to be smaller than the length of the corresponding main busbar lines in Y-axis direction below it, so that even if the region of welding strip covered by the curing adhesive has poor contact with the corresponding main busbar lines and fingers, then after lamination, the welding strip can be in good contact with the corresponding main busbar lines in the region not covered by curing adhesive. The current collected by the fingers in the region covered by curing adhesive is conducted through the connected main busbar lines to the corresponding main busbar lines in the region not covered by curing adhesive, and then led out through a welding strip. Under the same conditions, if there is no connection of main busbar line in the region covered by the UV adhesive (that is, the coverage area of the curing adhesive the area of the corresponding main busbar line below it), the UV adhesive will penetrate to the back of the welding strip, which results in poor contact or even insulation between the welding strip and the finger, and the current of the corresponding finger cannot be led out through the welding strip, which will affect the module power and reduce the CTM value of the back-contact solar cell module.

In the preparation method of the present disclosure, the welding strip is fixed with UV adhesive after being laid, and then cured by UV. The welding strip does not need to be cured at high temperatures. Therefore, no problem of cell deformation after fixing the welding strip occurs, and the welding strip is connected to the cell through the UV adhesive, such that the tensile force between the welding strip and the cell is significantly increased, thereby improving the module production yield. The welding strip of the present disclosure (preferably a low-temperature welding strip or called as a low-melting-point welding tape, such as a copper strip with a low melting point welding coating on the outer surface) is connected to the narrow main busbar line only after high-temperature lamination, and at this time, the welding strip can no longer deform under the clamping by the adhesive film, the positive plate, and the back plate, so there is no question of the deformation of the cell after the fixing of the welding strip.

BRIEF DESCRIPTION OF DRAWINGS

In order to more clearly illustrate the technical solutions of the embodiments of the present disclosure, the drawings to be used in the embodiments will be briefly described below, and it should be understood that the following drawings only show certain embodiments of the present disclosure, and therefore should not be regarded as limiting the scope, and other relevant drawings can be obtained from these drawings without inventive effort for those of ordinary skill in the art.

REFERENCE NUMERALS

Figure 1:
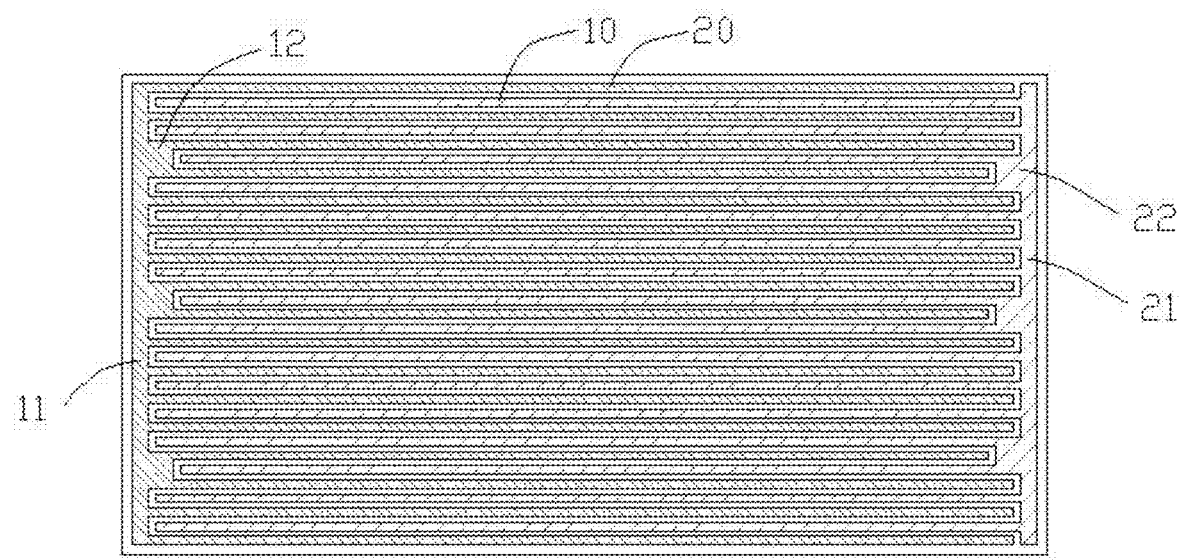
FIG. 1 is a schematic view of a back-contact cell with the first electrode structure of the prior art.

10—first finger, 20—second finger, 12—first pad, 22—second pad, 13—first insulation layer, 23—second insulation layer, 11—first main busbar line, 21—second main busbar line, 3—welding strip, 14—first connection point, 24—second connection point, 4—UV adhesive.

DETAILED DESCRIPTION OF EMBODIMENTS

The endpoints of the ranges and any values disclosed herein are not limited to that precise range or value, and those ranges or values should be understood to include values close to those ranges or values. For numerical ranges, the endpoint values of the individual ranges, the endpoint values of the individual ranges and the individual point values, and the individual point values can be combined to obtain one or more new numerical ranges, and these numerical ranges shall be deemed to be specifically disclosed herein. The terms "selectable" and "optional" mean that they can or cannot be included (or, can or cannot be available).

In the present disclosure, length is a dimension in the X-axis direction, width is a dimension in the Y-axis direction, and thickness is a dimension in the Z-axis direction.

Where specific conditions are not indicated in the Examples, conventional conditions or conditions recommended by the manufacturer were followed. The reagents or instruments used without indication of the manufacturer are conventional products that can be purchased commercially.

In addition, it is noteworthy that "and/or" as disclosed in the present disclosure includes three cases, e.g., A and/or B includes A alone, B alone, and both A and B.

The present disclosure provides a non-solder pad ultrafine main busbar back-contact solar cell including first fingers and second fingers, first main busbar lines and second main busbar lines, and a second insulation layer and a first insulation layer. The first finger and the second finger are arranged in an alternative manner along the Y-axis direction on the back side and both extend in the X-axis direction, wherein the first finger and the second finger are used to collect currents of two different polarities (of opposite polarities) of a cell. The first main busbar line is perpendicular to the first finger, and the second main busbar line is perpendicular to the second finger. Along the Z-axis direction, the first insulation layer is provided between the first main busbar line and the second finger and is in contact with the first main busbar line and the second finger respectively, and the second insulation layer is provided between the second main busbar line and the first finger and is in contact with the second main busbar line and the first finger respectively.

The present disclosure provides the first main busbar line as connecting to at least two first fingers, wherein at least one of the connected first fingers is closest to the X-axis edge on the back side. The second main busbar line is provided as connecting to at least two second fingers, wherein at least one of the connected second fingers is closest to the X-axis edge on the back side, and no pad is provided on either the first main busbar line or second main busbar line. It should be noted that the connection herein refers to the contacting of the corresponding main busbar line with the corresponding finger to achieve current convergence.

The widths in the X-axis direction of the first main busbar line and the second main busbar line described in the present disclosure are each independently 10-100 μm, for example, the widths can be but are not limited to, 10 μm, 20 μm, 30 μm, 40 μm, 50 μm, 60 μm, 70 μm, 80 μm, 90 μm, 100 μm and the like, independently of one another, or can be any value between the ranges formed by any two values of the foregoing. The present disclosure is able to reduce the silver paste consumption while improving the tensile force, and taking into account the higher module production yield and CTM value at the same time, under the condition of using a smaller width of the main busbar line.

The first main busbar lines or the second main busbar lines described in the present disclosure are respectively arranged in an extending manner or at intervals along the same axis perpendicular to the corresponding fingers connected thereto, and when spaced apart, the distance L between two adjacent corresponding main busbar lines in the Y-axis direction is 5-100 mm, preferably 10-100 mm, e.g., the distance L between two adjacent corresponding main busbar lines can be, but is not limited to, 5 mm, 10 mm, 20 mm, 30 mm, 40 mm, 50 mm, 60 mm, 70 mm, 80 mm, 90 mm, 100 mm, etc., or can be any value between the ranges formed between any two of the above values. In the present disclosure, the distance L is proper when arranged at intervals, which can ensure a fixed connection between the welding strip and the cell while taking into account a lower silver paste consumption and subsequent curing adhesive consumption at the same time, which is conducive to improving the production yield of the module and reducing the cost of materials. Under the same conditions, if L is too large or too small, it will lead to a decrease in module production yield or increase in material cost.

It is to be noted that, the first main busbar lines or the second main busbar lines described in the present disclosure are respectively arranged in an extending manner or at intervals along the same axis perpendicular to the corresponding fingers connected thereto, which means that the first main busbar lines are extended or arranged at intervals along the same axis perpendicular to the corresponding fingers to which they are connected, and the second main busbar lines are extended or arranged at intervals along the same axis perpendicular to the corresponding fingers to which they are connected.

In some preferred embodiments, the first main busbar lines and the second main busbar lines are arranged in pairs and are located in pairs at least on regions of both sides of the back side of the cell in the X-axis direction and/or the Y-axis direction. It can be understood that at least one pair of first main busbar line and second main busbar line is provided on the region of either side of regions of both sides in the X-axis direction and/or the Y-axis direction on the back side of the cell.

More preferably, the first main busbar line is provided on the Y-axis central axis of the first insulation layer in contact therewith or on the side surface of the Y-axis central axis, and the second main busbar line is provided on the Y-axis central axis of the second insulation layer in contact therewith or on the side surface of the Y-axis central axis. It can be understood that the same main busbar line can be located on the Y-axis central axis of the corresponding insulation layer or the side of the Y-axis central axis. Different main busbar lines can be partially located on the Y-axis central axis of the corresponding insulation layer and partially located on the side of the Y-axis central axis of the corresponding insulation layer.

Further preferably, the first main busbar line and/or second main busbar line are provided on the Y-axis central axis of the corresponding insulation layer in contact therewith and extend from one end of the back side of the cell in the Y-axis direction to the other end, respectively.

In some preferred embodiments, the first main busbar lines and second main busbar lines are each arranged at intervals along the same axis perpendicular to the corresponding fingers to which they are connected.

In some specific embodiments, the first main busbar lines and second main busbar lines are each arranged at intervals along the same axis perpendicular to the corresponding fingers to which they are connected, wherein the first main busbar line is placed on the Y-axis central axis of the first insulation layer in contact therewith, and the second main busbar line is placed on the Y-axis central axis of the second insulation layer in contact therewith. This preferred scheme is more conducive to reducing the consumption amount of silver paste, while at the same time taking into account the enhancement of tensile force and improving the module production yield and CTM value.

In some preferred embodiments, the first main busbar line comprises a first edge main busbar line proximate to an X-axis edge on the back side, and the second main busbar line comprises a second edge main busbar line proximate to an X-axis edge on the back side, wherein the first edge main busbar line and the second edge main busbar line both comprise a paired left main busbar line and right main busbar line, and the paired left main busbar line and right main busbar line are provided on both sides of the Y-axis center axis of the same corresponding insulation layer, respectively.

More preferably, the first main busbar line further comprises a first middle main busbar line located in the middle of the Y-axis of the back side, and the second main busbar line further comprises a second middle main busbar line located in the middle of the Y-axis of the back side, wherein the first middle main busbar line and the second middle main busbar line are respectively located on the Y-axis central axis of the corresponding insulation layers in contact therewith.

Further preferably, in the Y-axis direction, the distance L between adjacent corresponding edge main busbar lines and corresponding middle main busbar lines and/or between two adjacent corresponding middle main busbar lines is 10-100 mm, for example, the distance L can be, but is not limited to, 10 mm, 20 mm, 30 mm, 40 mm, 50 mm, 60 mm, 70 mm, 80 mm, 90 mm, 100 mm and the like, or it can be any value between ranges formed between any two of the above values.

In some preferred embodiments, the thicknesses in the Z-axis direction of the first main busbar line and the second main busbar line are each independently 5-30 µm, e.g., the thickness can each independently be, but is not limited to, 5 µm, 10 µm, 15 µm, 20 µm, 25 µm, 30 µm, and the like, or can be any value between the ranges formed between any two of the above values.

Preferably, the first finger and the second finger each independently meet: the width in the Y-axis direction is 10-100 µm, and the thickness in the Z-axis direction is 5-20 µm.

Typically, but not limiting, the width of each of the first finger and the second finger in the Y-axis direction can be 10 µm, 20 µm, 30 µm, 40 µm, 50 µm, 60 µm, 70 µm, 80 µm, 90 µm, 100 µm, and the like, or can be any value between ranges formed between any two of the above values.

Typically, but not limiting, the thickness of the first finger and the second finger in the Z-axis direction can each be 5 µm, 10 µm, 15 µm, 20 µm, etc., or can be any value in ranges formed between any two of the above values.

Preferably, the second insulation layer, and first insulation layer each independently satisfy: the length in the X-axis direction is 1-5 mm, the width in the Y-axis direction is 150-900 µm, and the thickness in the Z-axis direction is 20-70 µm.

Typically, but not limiting, the lengths of the first insulation layer and the second insulation layer in the X-axis direction can each be 1 mm, 2 mm, 3 mm, 4 mm, 5 mm, and the like, or can be any value between the ranges formed between any two of the above values.

Typically, but not limiting, the widths of the first insulation layer and the second insulation layer in the Y-axis direction can each be 150 µm, 200 µm, 250 µm, 300 µm, 350 µm, 400 µm, 450 µm, 500 µm, 600 µm, 700 µm, 800 µm, 900 µm, and the like, or can be any value between ranges formed by any two of the above values.

Typically, but not limiting, the thicknesses of the first insulation layer and the second insulation layer in the Z-axis direction can each be 20 µm, 30 µm, 40 µm, 50 µm, 60 µm, 70 µm, and the like, or can be any value in ranges formed between any two of the above values.

In some preferred embodiments, the number of corresponding fingers connected to the first main busbar line and the second main busbar line respectively is 2-10, wherein the first main busbar line and the second main busbar line are provided in pairs, and 2-20 pairs of corresponding main busbar lines are provided for each cell.

In some preferred embodiments, the second insulation layer and the first insulation layer are arranged in alternating manner and form two adjacent columns along the Y-axis direction, and at least some of the corresponding insulation layers are provided for setting up corresponding main busbar lines, which are spaced apart along the X-axis direction of their corresponding fingers, respectively. The second insulation layer and the first insulation layer are arranged in alternating manner and form two adjacent columns along the Y-axis direction, which means that the second insulation layer forms one column and the first insulation layer forms another column, and the adjacent second insulation layer and first insulation layer are set alternatively.

The preparation of each electrode structure in the present disclosure can refer to methods in the prior art, as long as the above-mentioned structure can be obtained, for example, it can be formed by printing or inkjet printing. Each of these fingers can be formed by means of printing silver paste or by means of electroplating copper grid lines.

Each of the main busbar lines and fingers in the present disclosure can be made of a silver paste or other type of conductive material, wherein the conductive material is, for example, a silver-coated copper paste.

In a second aspect, the present disclosure provides a back-contact solar cell module, including a plurality of cells arranged in series, wherein the cells are the pad-less ultrafine main grid back-contact cell described in the first aspect, and the back-contact solar cell module also includes a number of welding strips and curing adhesive. The welding strips are arranged above the Z-axis direction of each insulation layer and the corresponding main busbar line thereon and extend along the Y-axis direction. The welding strip connects several cells in a series connection.

The curing adhesive described in the present disclosure is located above the Z-axis direction of the welding strip area corresponding to the corresponding main busbar line, and it can be understood that the curing adhesive is located above the welding strip. The length of the curing adhesive in the Y-axis direction is smaller than the length of the corresponding main busbar lines in the Y-axis direction below it, so that even if the region of the welding strip covered by the curing adhesive has poor contact with the corresponding main busbar lines and fingers, then after lamination, the welding strip can be in good contact with the corresponding main busbar lines in the region not covered by curing adhesive. The current collected by the fingers in the region covered by curing adhesive is conducted through the connected main busbar lines to the corresponding main busbar lines in the region not covered by curing adhesive, and then led out through a welding strip, to ensure the CTM value of the back-contact solar cell module.

The series connection of the cells described in the present disclosure can be carried out in accordance with the prior art and can be, for example: adjacent cells are connected to each other by welding strips provided on the first main busbar line or the second main busbar line, and along the Y-axis direction the welding strips for connecting the former neighboring cell and the welding strips for connecting the latter neighboring cell are corresponding to different corresponding main busbar lines.

In some preferred embodiments, the curing adhesives are spaced apart in the Y-axis direction on the same welding strip. This preferred scheme is capable of uniformly dispersing the bonding force between the welding strip and the cell, thereby facilitating the improvement of the module production yield.

In some preferred embodiments, the difference between the length of the curing adhesive in the Y-axis direction and the length of a corresponding main busbar line in the Y-axis direction below it is 1 mm.

Preferably, the difference between the length of the curing adhesive in the Y-axis direction and the length of the corresponding main busbar line in the Y-axis direction below it is 1-5 mm, e.g. the difference can be, but is not limited to, 1 mm, 2 mm, 3 mm, 4 mm, 5 mm, etc., or it can be any value between the ranges formed by any two of the above values. This preferred scheme can ensure the yield of the connection between the welding strip and the cell, and at the same time reduce the consumption amount of silver paste for the main busbar line as much as possible, which is more conducive to improving the yield of the module production and reducing the cost of silver paste.

In the present disclosure, the length of the curing adhesive in the X-axis direction is greater than the length of the welding strip in the X-axis direction, which enables to wrap the welding strip and bind with the surface of the cell.

In some preferred embodiments, the welding strip is a copper strip with an outer surface coated with a low melting point welding coating, wherein the width of the copper strip in the X-axis direction is 0.3-2 mm and the thickness of the copper strip in the Z-axis direction is 0.05-0.2 mm.

Typically, but not limiting, the width of the copper strip in the X-axis direction can be 0.3 mm, 0.4 mm, 0.5 mm, 0.6 mm, 0.7 mm, 0.8 mm, 0.9 mm, 1 mm, 1.2 mm, 1.5 mm, 1.8 mm, 2 mm, and the like, or it can be any value between the ranges formed between any two of the foregoing values.

Typically, but not limiting, the thickness of the copper strip in the Z-axis direction can be 0.05 mm, 0.06 mm, 0.07 mm, 0.08 mm, 0.09 mm, 0.1 mm, 0.12 mm, 0.15 mm, 0.18 mm, 0.2 mm, and the like, or it can be any value between the ranges formed between any two of the above values.

Preferably, in the present disclosure, the low melting point welding coating has a melting point less than 155° C., preferably 120-145° C., e.g., the melting point can be, but is not limited to, 120° C., 130° C., 140° C., 145° C., etc., or can be any value between the ranges formed between any two of the above values.

The material of the low melting point welding coating described in the present disclosure only needs to meet the low melting point described above, for example, it can be at least one of tin, bismuth, silver, and indium.

In the third aspect, the present disclosure provides a preparation method of a back-contact solar cell module, wherein the back-contact solar cell module is the back-contact solar cell module described in the second aspect, and the preparation method comprises the following steps.

S1: Arranging the cells in series and laying the welding strip in the Z-axis direction of each insulation layer arranged along the Y-axis direction of the cell and the corresponding main busbar line on it.

S2: Forming UV adhesive in the corresponding welding strip region on each main busbar line, then curing by UV irradiation to form a curing adhesive.

S3: Sequentially assembling, laying with adhesive films, and setting up the front and back plates for the cell string obtained in S2, and then laminating to connect the welding strips with the corresponding fingers.

In some preferred embodiments, the thickness of the UV adhesive in S2 is 5-100 μm, and the energy of the curing is 300-3000 mJ/cm$^2$.

Typically, but not limiting, the thickness of the UV adhesive can be 5 μm, 10 μm, 20 μm, 30 μm, 40 μm, 50 μm, 60 μm, 70 μm, 80 μm, 90 μm, 100 μm, and the like, or it can be any value between ranges formed between any two of the above values.

Preferably, the temperature of the laminating in S3 is higher than the melting point temperature of the welding strip, and further preferably, the temperature of the laminating is 145-155° C.

In some preferred embodiments, the formation of the UV adhesive described in S2 is carried out by means of dispensing or spraying.

The laying of the adhesive film, the setting of the front plate and the back plate and the laminating as described in S3 are conventional module production processes, and it can be understood that the adhesive film is laid on the front side and back side of the cell string formed by connecting the cells in series, the front plate is provided on the front side of the cell string, and the back plate is provided on the back side of the cell string.

The lamination described in the present disclosure is capable of realizing the connection of the welding strip to the corresponding first finger and second finger respectively, with the connection points comprising: a first connection point of the welding strip to the first finger, and a second connection point of the welding strip to the second finger.

Examples of the present disclosure are described in detail below, and examples of the embodiments are shown in the drawings, wherein the same or similar reference numerals throughout represent the same or similar elements or elements with the same or similar functions. The embodiments described below by reference to the drawings are exemplary and are intended solely for the purpose of explaining the present disclosure and are not to be construed as a limitation of the present disclosure.

Example 1

A pad-less ultrafine multi-main-grid back-contact cell is prepared by the preparation method and has the structure as follows.

Figure 4:
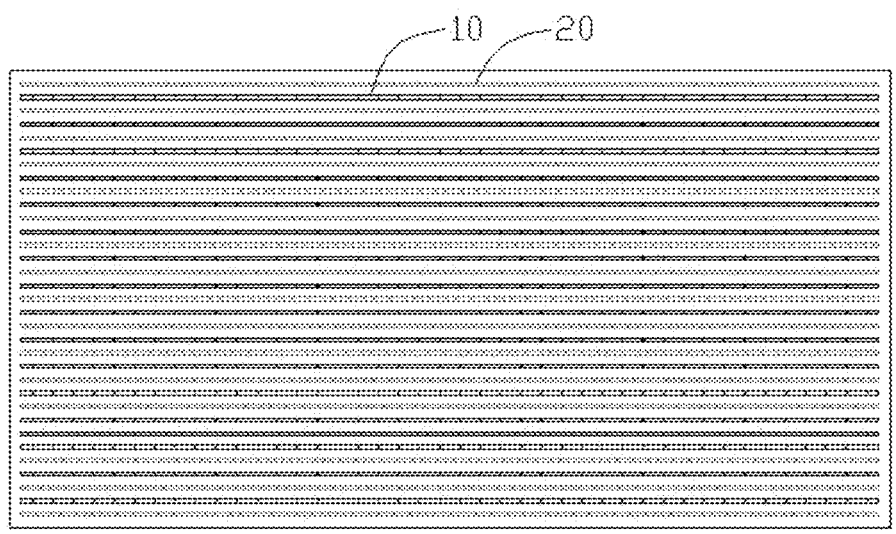
FIG. 4 is a schematic view of a back-contact cell provided in Example 1 of the present disclosure with corresponding fingers formed.

S101: as shown in FIG. 4, a back-contact cell electrode structure forming a fine gate electrode is provided, comprising:
 a first finger 10 for collecting the first polarity of the cell; and
 a second finger 20 for collecting the second polarity of the cell, which is arranged alternately with the first finger 10, wherein
 the first polarity and second polarity are of opposite polarities, the fingers are formed by means of printing silver paste, and the width of the first finger 10/second finger 20 is both 50 μm, and the thickness of both is 10 μm.

Figure 5:
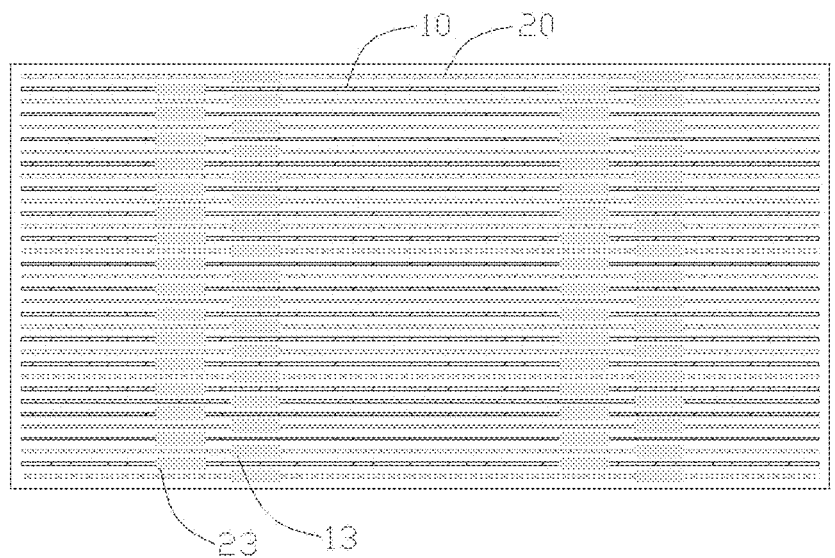
FIG. 5 is a schematic view of a back-contact cell with a corresponding insulation ink layer formed provided in Example 1 of the present disclosure and a schematic view of a back-contact cell with the electrode structure provided by Comparative Example 4.

S102: as shown in FIG. 5, an insulation ink layers are formed alternately on the first finger 10, and the second finger 20, comprising:
 a first insulation layer 13 for insulating the second polarity of the cell, wherein a number of the first insulation layers 13 are provided to form one column; and
 a second insulation layer 23 for insulating the first polarity of the cell, wherein a number of the second insulation layers 23 are provided to form another column, wherein
 the insulation ink layer is formed by means of printing, wherein the first insulation layer 13/second insulation layer 23 has a length of 3 mm, a width of 500 μm and a thickness of 30 μm.

Figure 6:
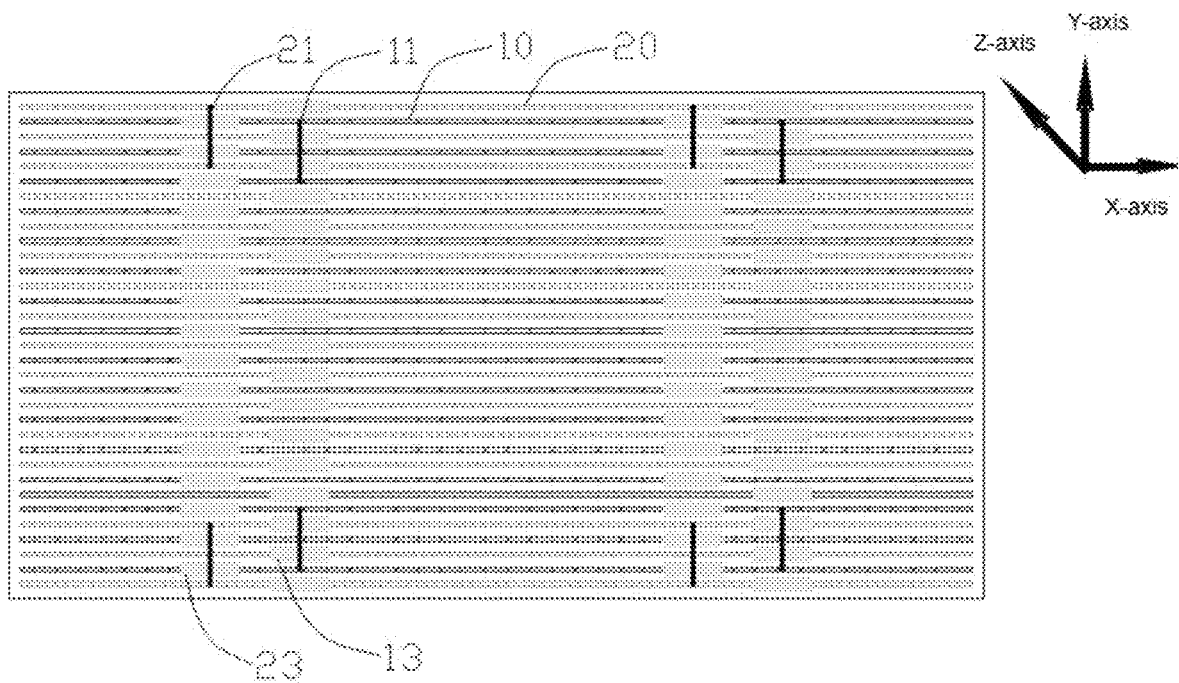
FIG. 6 is a schematic view of a back-contact cell with corresponding main busbar lines formed on the back side of the cell of Example 1 of the present disclosure.

S103: as shown in FIG. 6, silver-paste main busbar lines are formed on the first finger 10 and the second finger 20 at both ends of the cell, the silver-paste main busbar lines comprising:

a first main busbar line 11 for connecting the first finger 10 at the end of the cell; and a second main busbar line 21 for connecting the second finger 20 at the end of the cell, wherein the silver-paste main busbar lines are formed by means of printing, the width of the first main busbar line 11/second main busbar line 21 is both 50 μm, the thickness of both is 10 μm, and three first finger 10 or three second finger 20 are connected to the main busbar line. The first main busbar line 11 and the second main busbar line 21 are formed in pairs, with four pairs of main busbar lines on each cell.

The silver-paste main busbar lines are provided at both ends of the cell and located on the Y-axis center axis of the corresponding insulation ink layer in contact therewith, and the silver-paste main busbar lines are connected to the first finger 10 and the second finger 20 counting inwardly from the outermost edge of the cell respectively, and the distance L between one main busbar line and the adjacent corresponding main busbar line in the direction of perpendicular corresponding fingers is 80 mm.

For the pad-less ultrafine multi-main-grid back-contact solar cell module, the preparation method and structure thereof are as follows.

Figure 11:
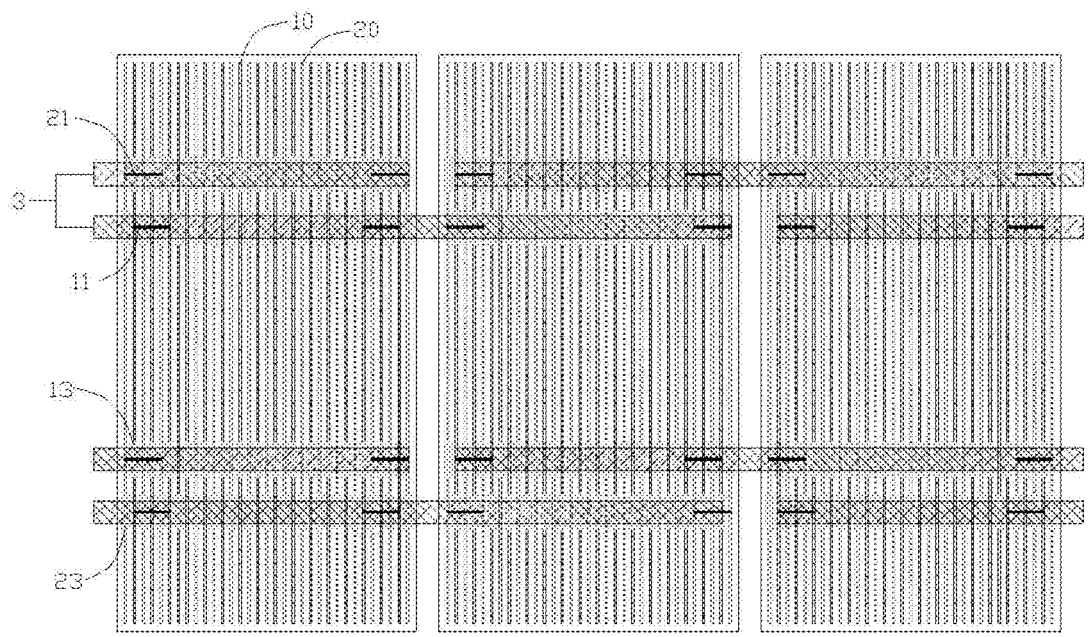
FIG. 11 is a schematic view of laying the welding strip when series welding of the production module of the back-contact cell of Example 1 of the present disclosure.

S104: as shown in FIG. 11, the cells are arranged in series, and welding strips 3 are laid on the upper surface of each insulation ink layer of the cells, wherein the welding strip 3 is a copper strip coated with a low-melting-point weldable coating on the surface of the copper strip, the copper tape has a width of 0.8 mm in the X-axis direction, and has a thickness of 0.1 mm in the Z-axis direction, and the melting point of the weldable coating is in the range of 120-145° C.

Adjacent cells are connected through the welding strip 3 provided on the first main busbar line 11 or the second main busbar line 21, and the corresponding main busbar line (which is the first main busbar line 11) for connecting to the welding strip 3 of previous adjacent cell along the Y-axis direction is different from the corresponding main busbar line (which is the second main busbar line 21) of the welding strip 3 for connecting to the next adjacent cell.

Figure 12:
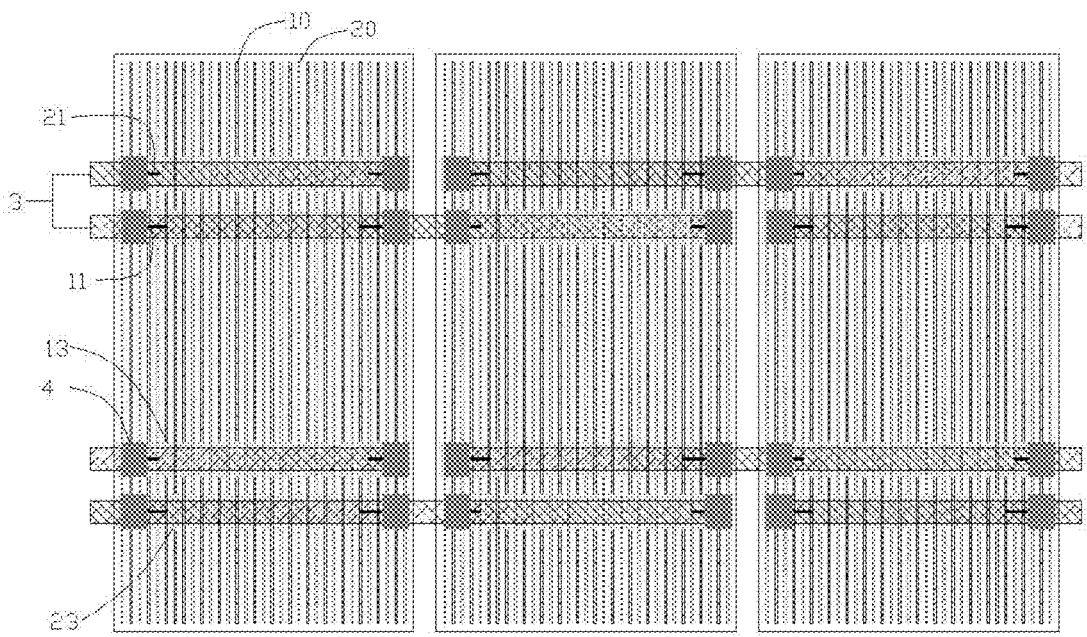
FIG. 12 is a schematic view after curing of the dispensed adhesive at both ends of the cell when series welding of the production module of the back-contact cell of Example 1 of the present disclosure.

S105: as shown in FIG. 12, a UV adhesive 4 is formed in the region of the corresponding welding strip 3 on each main busbar line by dispensing, after which curing is carried out by UV irradiation to form a curing adhesive, wherein the UV adhesive 4 has a thickness of 60 μm, and the UV curing energy is 1000 mJ/cm$^2$.

The curing adhesive is located above the Z-axis direction of the region of the welding strip 3 corresponding to the corresponding main busbar line, the length of the curing adhesive in the Y-axis direction is less than the length of the corresponding main busbar line in the Y-axis direction below it, the difference between the length of the curing adhesive in Y-axis direction and the length of the corresponding main busbar line in Y-axis direction below it is 2 mm, and the length of the curing adhesive in X-axis direction is greater than the length of the welding strip in X-axis direction.

Figure 13:
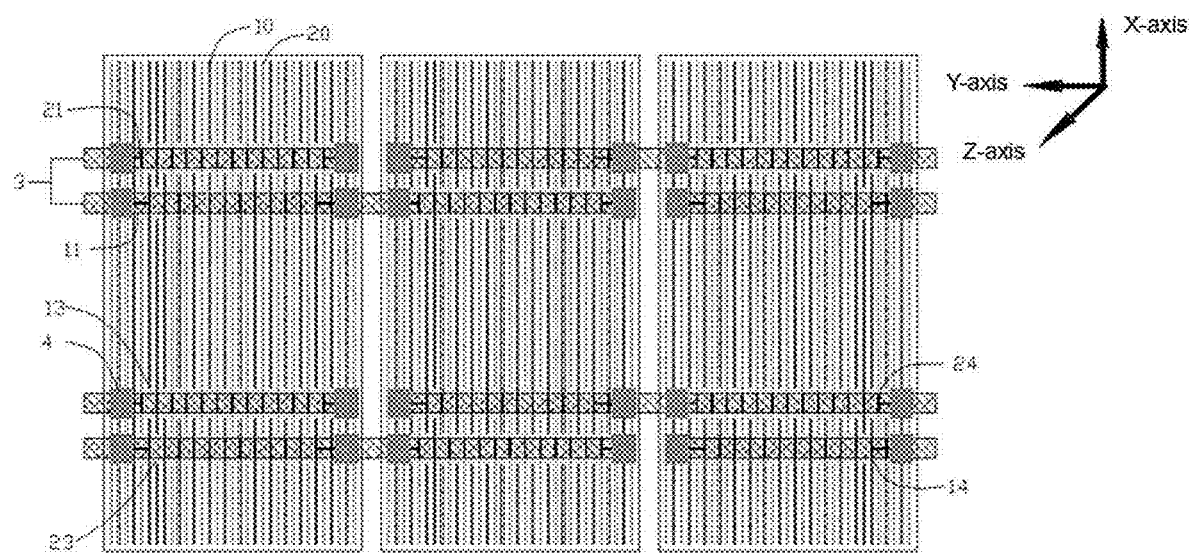
FIG. 13 is a schematic view after connecting the welding strip and fine grid electrode after series welding and laminating of the production module of the back-contact cell of Example 1 of the present disclosure.

S106: following the conventional method, the cell string after series connection is converged, and the adhesive film and front and back plate materials are laid on the front side and back side of the cells respectively, and then laminated. As shown in FIG. 13, after lamination, the welding strip 3 is connected to the first finger 10 and the second finger 20 respectively, wherein the connection points include:

a first connection point 14 of the welding strip 3 to the first finger 10; and a second connection point 24 of the welding strip 3 to the second finger 20, wherein the lamination temperature is 155° C., and the module is formed after lamination.

Example 2

Differences from Example 1 are as follows.

Figure 7:
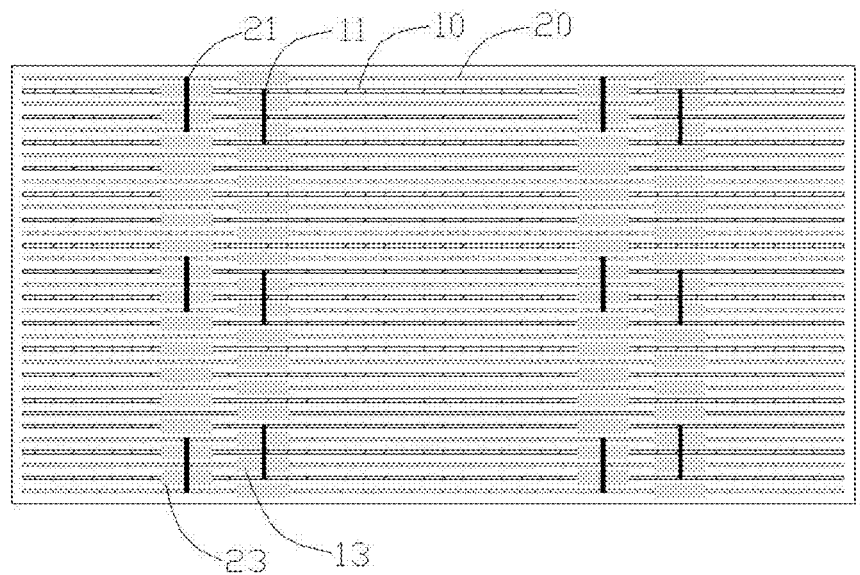
FIG. 7 is a schematic view of a back-contact cell with corresponding main busbar lines formed on the back side of the cell of Example 2 of the present disclosure.

S103: as shown in FIG. 7, a silver paste grid line is respectively formed on the first finger 10 and the second finger 20 at both ends of the cell (that is the side region) and the middle region as a pair of main busbar lines, that is three pairs of main busbar lines are formed on the cell in Y-axis direction. Subsequently, UV adhesive 4 is simultaneously formed on the corresponding main busbar line located in the middle region. In the Y-axis direction, the distance L between adjacent main busbar lines is 40 mm.

Example 3

Differences from Example 1 are as follows.

Figure 8:
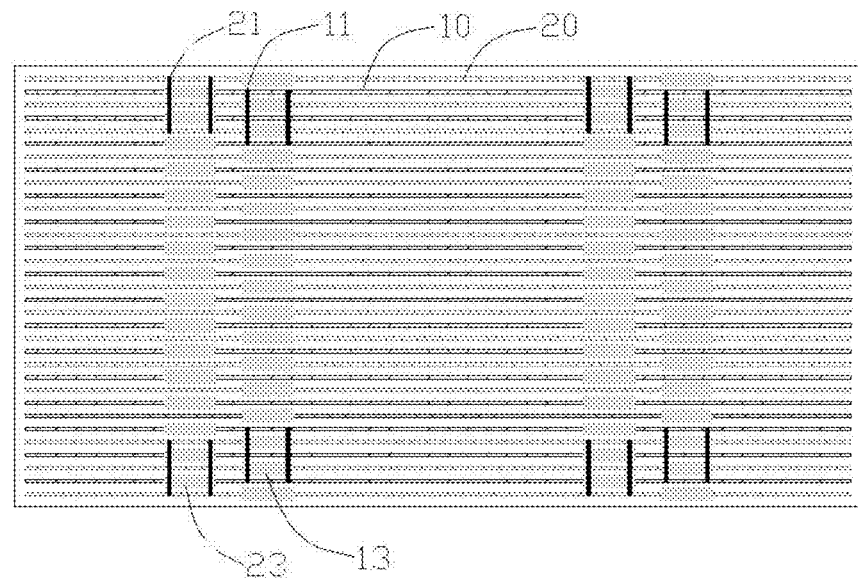
FIG. 8 is a schematic view of a back-contact cell with corresponding main busbar lines formed on the back side of the cell of Example 3 of the present disclosure.

S103: as shown in FIG. 8, two silver paste grid lines are formed on the first finger 10 and the second finger 20 at both ends of the cell as a pair of main busbar lines of the same kind, that is the number of corresponding main busbar lines of the same type is two and they are symmetrically arranged on both sides of the corresponding insulation ink layer in the same column.

Example 4

Differences from Example 1 are as follows.

Figure 9:
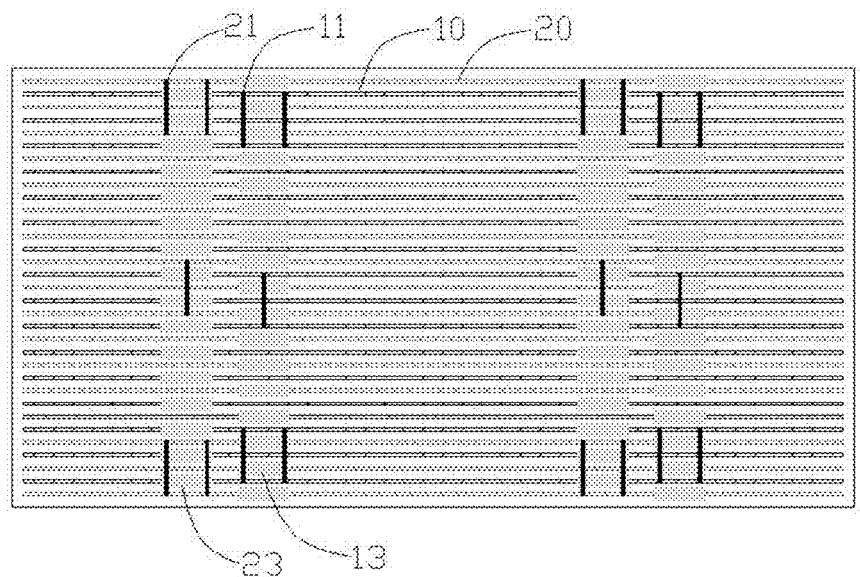
FIG. 9 is a schematic view of a back-contact cell with corresponding main busbar lines formed on the back side of the cell of Example 4 of the present disclosure.

S103: as shown in FIG. 9, the main busbar lines of the same type formed on the first fingers 10 and the second fingers 20 at both ends of the cell are two adjacent ones and are symmetrically arranged on both sides of the corresponding insulation ink layer in the same column, and adjacent different types of main busbar lines in pairs are a total of 4 main busbar lines; and a silver paste grid line is formed on the first finger 10 and the second finger 20 in the middle region of the cell, and together with the silver paste grid line formed simultaneously at the adjacent column, serves as a pair of main busbar lines, wherein a total of 2 main busbar lines are in one pair of the main busbar lines. In the Y-axis direction, the distance L between adjacent main busbar lines is 40 mm.

Example 5

Differences from Example 1 are as follows.

Figure 10:
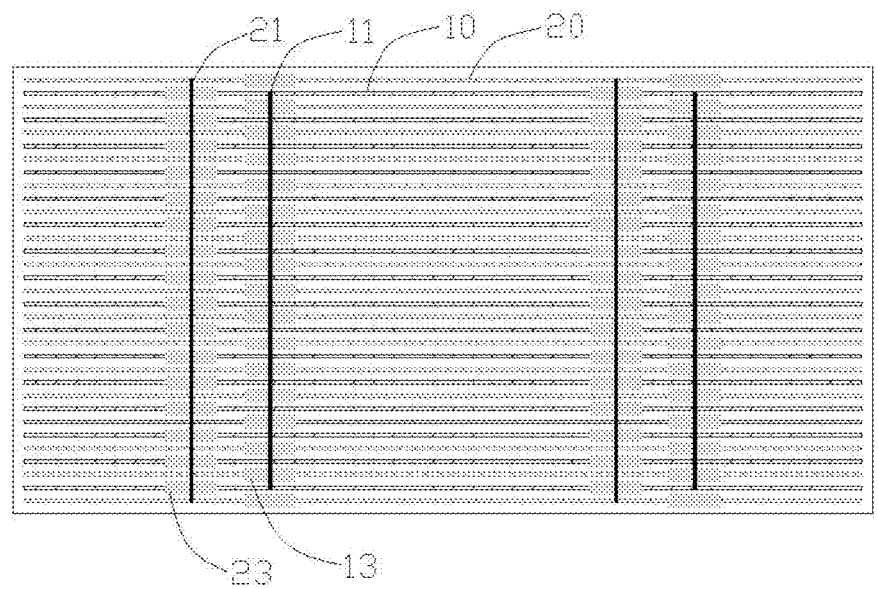
FIG. 10 is a schematic view of a back-contact cell with corresponding main busbar lines formed on the back side of the cell of Example 5 of the present disclosure.

S103: as shown in FIG. 10, one silver paste grid line is formed on the first finger 10 and the second finger 20 on the back side of the cell, extending completely from one end to the other end in the Y-axis direction of the cell, and together with a silver paste grid line formed synchronously at the adjacent column, serves as one pair of silver-paste main busbar lines.

Example 6

Differences from Example 1 are as follows.

The length of the main busbar line in the Y-axis direction is adjusted, so that the difference between this length and the length of the curing adhesive above it in the Y-axis direction is 6 mm.

Example 7

Differences from Example 1 are as follows.

The length of the main busbar line in the Y-axis direction is adjusted, so that the distance L between two adjacent corresponding main busbar lines in the Y-axis direction is 5 mm.

Comparative Example 1

As shown in FIG. 1, the first main busbar line 11/second main busbar line 21 of the electrodes with opposite polarities and the first pad 12/second pad 22 are designed to be located at the edges of two sides of the cell, respectively, and carriers need to be transferred from one side of the cell to the other side, and the length of the first finger 10/second finger 20, which collects the carriers, is very long. Long-distance carrier transmission has very high conductivity requirement on fingers. Taking copper grid lines with good conductivity as an example, the first finger 10/second finger 20 generally accounts for more than 80% area of the back side of the cell. At the same time, the thickness of the copper grid line needs to be more than 30 μm, which greatly reduces the double-sided ratio of the cell and seriously affects the production capacity of the copper grid electrode equipment. In addition, there is environmental pressure in the copper electroplating process. During the subsequent production of the module, the first pad 12/second pad 22 on the edges of both sides of the cell are alternately connected with welding strips to form a cell string.

In short, Comparative Example 1 has the following problems: a) the conductivity requirements of the finger are very high, the area of the grid line accounts for more than 80% of the back side of the cell, and the cell bifaciality is low; b) the thickness of the copper grid electrode is very high, which seriously affects the production capacity of the copper grid electrode equipment; and c) the environmental protection pressure exists on the copper grid process.

Comparative Example 2

Figure 2:
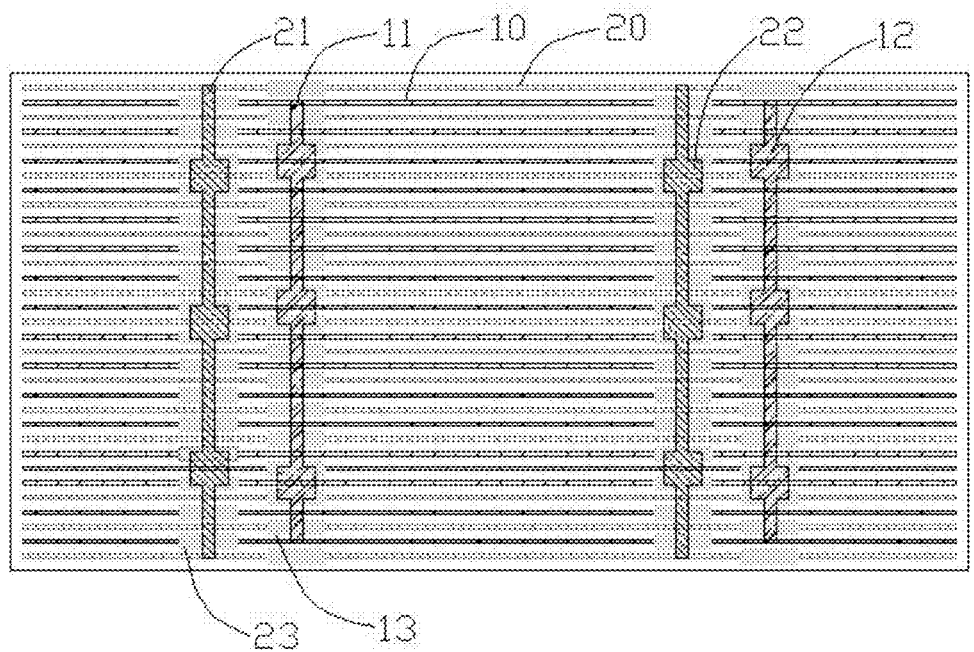
FIG. 2 is a schematic view of a back-contact cell with the second electrode structure of the prior art.

As shown in FIG. 2, after printing the silver paste to form the first fingers 10/second fingers 20 of the electrodes with opposite polarities arranged in a crosswise manner, alternately arranged first insulation layers 13/second insulation layers 23 are printed on the upper surface of the first fingers 10/second fingers 20, then silver paste is printed to form the first main busbar line 11/second main busbar line 21 and the first pad 12/second pad 22. The width of the first main busbar line 11/second main busbar line 21 is greater than 0.1 mm, the size of the first pad 12/second pad 22 is close to 1 mm×1 mm, the silver paste consumption of the first main busbar line 11/second main busbar line 21 and the first pad 12/second pad 22 is close to the consumption of that of the first finger 10/second finger 20, such that a large amount of expensive silver paste is needed, and the cost of electrodes is greatly increased.

The subsequent production of the module is carried out according to the method of Example 1, except that the welding strip 3 of S105 is fixed on the pad through high-temperature welding, wherein the corresponding temperature of the high-temperature welding is 170-270° C. When producing the module, because the back-contact cell is single-sided welding, the welding strip 3 has a large stress after being cooled after high-temperature welding, causing the cell to have a large deformation after welding. In addition, the welding tension between the welding strip 3 and the silver-paste main busbar line during the series welding process for the cell is generally less than 1 N, problems such as falling off of the welding strip 3 and the silver-paste main busbar line may easily occur during the process after series welding, thus affecting the production yield of production module of the cell.

In short, Comparative Example 2 has the following problems: a) the main busbar line and pad need to use a large amount of low-temperature silver paste, and the material cost is high; b) after high-temperature series welding of production modules, phenomena such as large deformation of the cell and insufficient welding tension between the welding strip 3 and the main busbar line exist, thereby affecting the production yield of the production module of the cell.

Comparative Example 3

Figure 3:
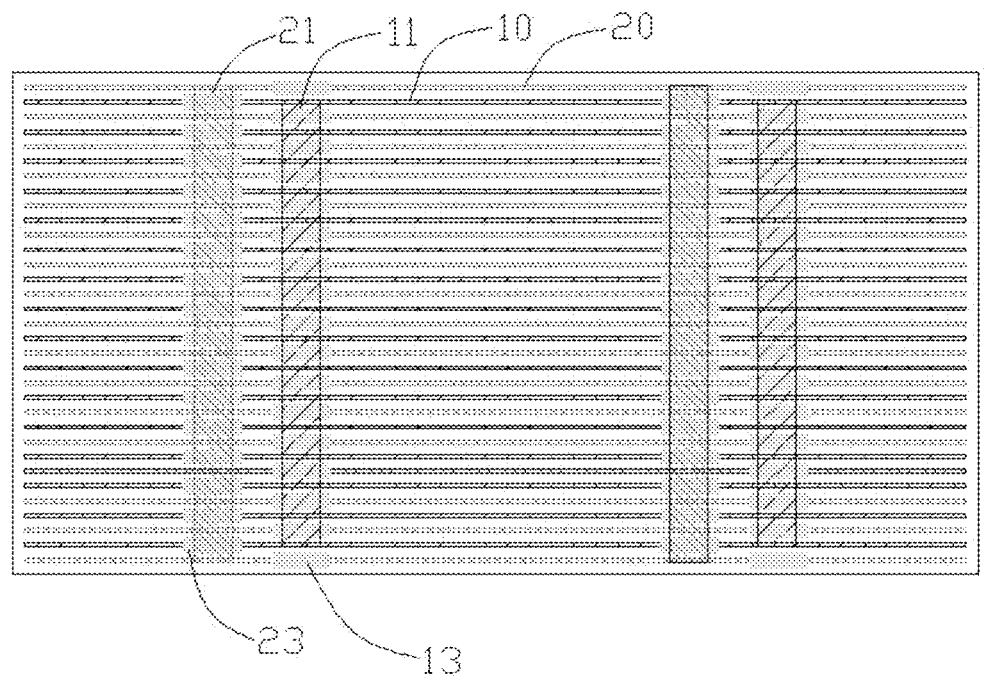
FIG. 3 is a schematic view of a back-contact cell with the third electrode structure of the prior art.

As shown in FIG. 3, after printing the silver paste to form the first fingers 10/second fingers 20 of the electrodes with opposite polarities arranged in a crosswise manner, alternately arranged first insulation layers 13/second insulation layers 23 are printed on the upper surfaces of the first fingers 10/second fingers 20, and then silver paste is printed to form the first main busbar line 11/second main busbar line 21, which are quite wide, wherein the width of the first main busbar line 11/second main busbar line 21 is generally greater than 0.5 mm. The silver paste consumption of the first main busbar line 11/second main busbar line 21 is close to that of the first fine gate line 10/second fine gate line 20, which requires a large amount of expensive silver paste, thereby significantly increasing the cost of the electrode.

The subsequent production of the module is carried out according to the method of Example 1, except that the welding strip 3 of S105 is fixed on the main busbar line through high-temperature welding, wherein the corresponding temperature of the high-temperature welding is 170-270° C. When producing the module, because the back-contact cell is single-sided welding, the welding strip 3 has a large stress after being cooled after high-temperature welding, causing the cell to have a large deformation after welding. In addition, the welding tension between the welding strip 3 and the silver-paste main busbar line during the series welding process for the cell is generally less than 1 N, problems such as falling off of the welding strip 3 and the silver-paste main busbar line may easily occur during the process after series welding, thus affecting the production yield of production module of the cell.

In short, Comparative Example 3 has the following problems: a) this Comparative Example is mainly based on the consideration of welding tension, deformation occurs on the cell after welding of the welding strip, and after deformation of cell, there is a risk of partial detachment of the welding strip and the main busbar line. Therefore, the entire wide main busbar line is adopted to better avoid the risk of the local detachment of welding strips and main busbar lines after welding, which has no impact on cell efficiency. However, the main busbar lines and pads require the use of a large amount of low-temperature silver paste, and the material cost is high. b) After high-temperature series welding of production modules, phenomena such as large deformation of the cell and insufficient welding tension between the welding strip 3 and the main busbar line exist, thereby affecting the production yield of the production module of the cell.

Comparative Example 4

As shown in FIG. 5, after printing the silver paste to form the first fingers 10/second fingers 20 of the electrodes with opposite polarities arranged in a crosswise manner, alternately arranged first insulation layers 13/second insulation layers 23 are printed on the upper surface of the first fingers 10/second fingers 20, then there is no need to print silver paste to form the main grid electrode. The first finger 10 and the second finger 20 on the back side of the cell are arranged alternately and of opposite polarities, so that each electrode fine grid is independent. The subsequent production of the module is carried out according to the method of Example 1, wherein in the process of producing the module, when the welding strip 3 is fixed with UV adhesive 4, the UV adhesive 4 will penetrate between the welding strip 3 and the electrode fingers, resulting in poor contact or even insulation between the welding strip 3 and the electrode fingers in the region covered with UV adhesive 4, which greatly affects the power of the modules, thus reducing the CTM value of the cell to the module.

In Comparative Example 4, the UV adhesive 4 easily penetrates between the welding strip 3 and the electrode finger, resulting in poor contact or even insulation in the area where the UV adhesive 4 is dispensed, thereby affecting the CTM value when the cell is made into a module.

Comparative Example 5

Differences from Example 1 are as follows.
The length in the Y-axis direction of the main busbar lines is adjusted so that the distance L between two adjacent corresponding main busbar lines spaced in the Y-axis direction is 150 mm.

Test Example

The above Examples and the Comparative Examples went through a performance test, the parameter data of each performance index are shown in Table 1. The CTM (Cell To Module), refers to the power ratio of the cell after it is made into a module; and tension force refers to the tension between the welding strip and the main busbar line.

in the scope of the present disclosure, the electrode structures or key parameters are inappropriate, and the combined effect is worse than that of the present disclosure.

Further, according to Example 1 and Example 2 of the present disclosure, it can be seen that the scheme of Example 2 with the preferred main busbar line structure of the present disclosure can further improve the production yield, although the silver paste consumption is slightly increased.

Further, according to Example 1 and Examples 3-4 of the present disclosure, it can be seen that adopting the scheme of Example 1 of the preferred main grid structure of the present disclosure is more conducive to improving the CTM value while reducing the silver paste consumption.

Further, according to Example 1 and Example 5 of the present disclosure, it can be seen that adopting the scheme of Example 1 of the preferred main busbar line structure of the present disclosure is more conducive to significantly reducing the amount of silver paste consumed, and at the same time, ensuring a higher production yield of the module.

Further, according to Example 1 and Examples 6-7 of the present disclosure, it can be seen that adopting the scheme of preferred Example 1 of the present disclosure is more conducive to reducing the amount of silver paste consumption while ensuring the performance of the cell and its module.

Preferred embodiments of the present disclosure are described in detail above, however, the present disclosure is not limited thereto. Within the scope of the technical concept of the present disclosure, a variety of simple modifications can be made to the technical solution of the present disclosure, including the combination of various technical features in any other suitable manner. These simple modifications and combinations should also be regarded as the disclosed content of the present disclosure, which all belong to the protection scope of the present disclosure.

INDUSTRIAL APPLICABILITY

The non-solder pad ultrafine main busbar back-contact solar cell in the present disclosure does not set up pads, such

TABLE 1

| Number of Example | Consumption of Silver Paste (mg/sheet) | Tension (N) | Deformation after Fixing the Welding Strip (mm) | Production Yield of Module (%) | Bifaciality of Cell (%) | CTM Value (%) |
|---|---|---|---|---|---|---|
| Example 1 | 75 | >2 | 0 | 99.8 | 70 | 100% |
| Example 2 | 77 | >2 | 0 | 99.85 | 70 | 100% |
| Example 3 | 81 | >2 | 0 | 99.8 | 70 | 99.5% |
| Example 4 | 79 | >2 | 0 | 99.85 | 70 | 99.5% |
| Example 5 | 85 | >2 | 0 | 99.9 | 70 | 100% |
| Example 6 | 77 | >2 | 0 | 99.8 | 70 | 100% |
| Example 7 | 81 | >2 | 0 | 99.8 | 70 | 100% |
| Comparative Example 1 | 0 | 1 | 3 | 99.5 | 10 | 100% |
| Comparative Example 2 | 160 | 0.5 | 10 | 99.1 | 70 | 100% |
| Comparative Example 3 | 220 | 0.5 | 10 | 99.3 | 70 | 100% |
| Comparative Example 4 | 71 | >2 | 0 | 99.5 | 70 | 95% |
| Comparative Example 5 | 73 | >2 | 0 | 99.5 | 70 | 99% |

As can be seen from the above effect data, compared to the Comparative Examples, the back-contact cell of the present disclosure is characterized by low cost (low silver consumption) and high bifaciality, and at the same time has the advantages of high tensile force of connecting the welding strip to the cell when making the module and small deformation of cell after connecting, which is able to improve the production yield of the production module of the back-contact cell and at the same time ensure a higher CTM value. In Comparative Examples 1-3 and Comparative Example 4 in the prior art, and Comparative Example 5 not that welding is not required, thereby avoiding the deformation of the cell caused by welding in the prior art. The cured adhesive can be used to fixedly connect the welding strip and cell during the subsequent formation of the module, and the welding strip has no need to be processed at high temperatures, thus ensuring the production yield; and the width of the main busbar lines is very small, and when the corresponding main busbar lines are arranged at intervals, the main busbar lines can be formed by segmented printing, thus significantly reducing the consumption of silver paste for the main busbar lines. The distance L between two adjacent corresponding main busbar lines in the Y-axis direction when arranged at intervals is controlled to be 5-100 mm, such that the distance L is appropriate, thereby ensuring the fixed connection between the welding strip and the cell and taking into account the lower amount of silver paste and subsequent curing adhesive, which is conducive to improving the module production yield and reducing the cost of materials.

In the present disclosure, the back-contact solar cell module uses a non-solder pad ultrafine main busbar back-contact solar cell in combination with welding strip and curing adhesive, wherein the curing adhesive has excellent bonding force. At the same time, the binding process does not require high temperatures, so deformation will not occur on cells. At the same time, the present disclosure sets the length of the curing adhesive in the Y-axis direction to be smaller than the length of the corresponding main busbar lines in Y-axis direction below it, so that even if the region of welding strip covered by the curing adhesive has poor contact with the corresponding main busbar lines and fingers, then after lamination, the welding strip can be in good contact with the corresponding main busbar lines in the region not covered by curing adhesive. The current collected by the fingers in the region covered by curing adhesive is conducted through the connected main busbar lines to the corresponding main busbar lines in the region not covered by curing adhesive, and then led out through a welding strip.

In the preparation method of the present disclosure, the welding strip is fixed with UV adhesive after being laid, and then cured by UV. The welding strip does not need to be cured at high temperatures. Therefore, no problem of cell deformation after fixing the welding strip occurs, and the welding strip is connected to the cell through the UV adhesive, such that the tensile force between the welding strip and the cell is significantly increased, thereby improving the module production yield. The welding strip of the present disclosure is connected to the narrow main busbar line only after high-temperature lamination, and at this time, the welding strip can no longer deform under the clamping by the adhesive film, the positive plate, and the back plate, so there is no question of the deformation of the cell after the fixing of the welding strip.

In addition, it can be understood that the non-solder pad ultrafine main busbar back-contact solar cell, back-contact solar cell module and preparation method provided by the embodiments of the present disclosure is reproducible and can be used in a variety of industrial applications. For example, the non-solder pad ultrafine main busbar back-contact solar cell, back-contact solar cell module and preparation method provided by the embodiments of the present disclosure can be applied to the technical field of back-contact cells.

The invention claimed is:

1. A back-contact solar cell module, comprising a number of cells arranged in series, wherein the cells are non-solder pad ultrafine main busbar back-contact solar cells, wherein each of the non-solder pad ultrafine main busbar back-contact solar cells comprising a first finger and a second finger arranged alternately along a Y-axis direction on a back side and both extended and provided in an X-axis direction to collect currents of two different polarities of a cell, a first main busbar line perpendicular to the first finger, a second main busbar line perpendicular to the second finger, a first insulation layer, in a Z-axis direction, provided between and respectively being in contact with the first main busbar line and the second finger, and a second insulation layer provided between and respectively being in contact with the second main busbar line and the first finger, wherein the first main busbar line is connected to at least two first fingers and at least one of connected first fingers is closest to an X-axis edge on the back side, and the second main busbar line is connected to at least two second fingers and at least one of connected second fingers is closest to the X-axis edge on the back side; no pad is provided on the first main busbar line and the second main busbar line, and widths in the X-axis direction of the first main busbar line and the second main busbar line are each independently 10-100 µm; and first main busbar lines or second main busbar lines are provided in an extending manner or at intervals along the same axis perpendicular to corresponding fingers connected thereto, respectively, and when spaced apart, a distance L between two adjacent corresponding main busbar lines in the Y-axis direction is 5-100 mm, wherein the first main busbar line and the second main busbar line are provided in pairs and their pairs are provided at least in regions on both sides of the back side of the cell in the X-axis direction and/or in the Y-axis direction, and the back-contact solar cell module further comprises a number of welding strips and curing adhesive, wherein the welding strips are provided over the Z-axis direction of each insulation layer and corresponding main busbar lines thereon and extend in the Y-axis direction, and the welding strips connect the number of cells in series; and the curing adhesive is provided above the Z-axis direction in welding strip regions corresponding to the corresponding main busbar lines, and a length in the Y-axis direction of the curing adhesive is smaller than a length in the Y-axis direction of the corresponding main busbar lines below the curing adhesive.

2. The back-contact solar cell module according to claim 1, wherein on the same welding strip, the curing adhesive is spaced apart in the Y-axis direction, and a length of the curing adhesive in the X-axis direction is greater than a length of the welding strip in the X-axis direction;
and/or
a difference between a length of the curing adhesive in the Y-axis direction and a length of a corresponding main busbar line in the Y-axis direction below the curing adhesive is ≥1 mm.

3. The back-contact solar cell module according to claim 1, wherein the welding strips each are a copper strip coated with a low melting point welding coating on an outer surface, a width of the copper strip in the X-axis direction is 0.3-2 mm, a thickness of the copper strip in the Z-axis direction is 0.05-0.2 mm, and a melting point of the low melting point welding coating is lower than 155° C.

4. The back-contact solar cell module according to claim 1, wherein in each of the non-solder pad ultrafine main busbar back-contact solar cells, the each first main busbar line is provided on a Y-axis central axis of the first insulation layer in contact therewith or on a side of the Y-axis central axis, and the each second main busbar line is provided on a Y-axis central axis of the second insulation layer in contact therewith or on a side of the Y-axis central axis.

5. The back-contact solar cell module according to claim 4, wherein in each of the non-solder pad ultrafine main busbar back-contact solar cells, the each first main busbar line and/or each second main busbar line are provided on a Y-axis central axis of a corresponding insulation layer in contact therewith and extend from one end of the back side of the cell in the Y-axis direction to the other end, respectively.

6. The back-contact solar cell module according to claim 1, wherein in each of the non-solder pad ultrafine main busbar back-contact solar cells, the each first main busbar line comprises a first edge main busbar line proximate to the X-axis edge on the back side, and the each second main busbar line comprises a second edge main busbar line proximate to the X-axis edge on the back side, wherein the first edge main busbar line and the second edge main busbar line both comprise a paired left main busbar line and right main busbar line, and the paired left main busbar line and right main busbar line are provided on both sides of a Y-axis center axis of the same corresponding insulation layer, respectively.

7. The back-contact solar cell module according to claim 6, wherein in each of the non-solder pad ultrafine main busbar back-contact solar cells, the each first main busbar line further comprises a first middle main busbar line located in a middle of a Y-axis of the back side, and the each second main busbar line further comprises a second middle main busbar line located in the middle of the Y-axis of the back side, wherein the first middle main busbar line and the second middle main busbar line are respectively located on the Y-axis central axis of the corresponding insulation layer in contact therewith, and in the Y-axis direction, a distance L between the adjacent corresponding edge main busbar line and corresponding middle main busbar line, and/or between two adjacent corresponding middle main busbar lines, is 10-100 mm.

8. The back-contact solar cell module according to claim 1, wherein in each of the non-solder pad ultrafine main busbar back-contact solar cells, thicknesses in the Z-axis direction of the each first main busbar line and the each second main busbar line are each independently 5-30 µm; and the first finger and the second finger each independently meet: a width in the Y-axis direction is 10-100 µm, and a thickness in the Z-axis direction is 5-20 µm; and the second insulation layer and the first insulation layer each independently satisfy: a length in the X-axis direction is 1-5 mm, a width in the Y-axis direction is 150-900 µm, and a thickness in the Z-axis direction is 20-70 µm.

9. The back-contact solar cell module according to claim 1, wherein in each of the non-solder pad ultrafine main busbar back-contact solar cells, the number of corresponding fingers connected to the each first main busbar line and the each second main busbar line, respectively, is 2-10, the each first main busbar line and the each second main busbar line are provided in pairs, and 2-20 pairs of corresponding main busbar lines are provided for each cell.

10. The back-contact solar cell module according to claim 1, wherein in each of the non-solder pad ultrafine main busbar back-contact solar cells, the second insulation layer and the first insulation layer are arranged alternatively and form two adjacent columns along the Y-axis direction, and at least some of corresponding insulation layers are provided for setting up corresponding main busbar lines, which are spaced apart along the X-axis direction of their corresponding fingers, respectively.

* * * * *